United States Patent
Kim

(10) Patent No.: US 6,590,828 B2
(45) Date of Patent: Jul. 8, 2003

(54) APPARATUS AND METHOD FOR INPUTTING ADDRESS SIGNALS IN SEMICONDUCTOR MEMORY DEVICE

(75) Inventor: Tae Hoon Kim, Seoul (KR)

(73) Assignee: Coremagic, Inc., Seoul (KR)

( * ) Notice: Subject to any disclaimer, the term of this patent is extended or adjusted under 35 U.S.C. 154(b) by 0 days.

(21) Appl. No.: 10/046,828

(22) Filed: Jan. 15, 2002

(65) Prior Publication Data

US 2003/0053365 A1 Mar. 20, 2003

(30) Foreign Application Priority Data

Sep. 18, 2001 (KR) ........................................ 2001-57661

(51) Int. Cl.[7] ................................................ G11C 8/00
(52) U.S. Cl. .................... 365/233; 365/230.06; 365/194
(58) Field of Search ............................ 365/233, 230.06, 365/194

(56) References Cited

U.S. PATENT DOCUMENTS 5,844,857 A * 12/1998 Son et al. .............. 365/230.06
6,154,415 A * 11/2000 Jeong ........................ 365/233

* cited by examiner

Primary Examiner—Huan Hoang
(74) Attorney, Agent, or Firm—Harness, Dickey & Pierce, P.L.C.

(57) ABSTRACT

Disclosed is an address input apparatus of a semiconductor memory device having a unit cell including a capacitor, comprising an internal clock generator for generating and outputting an internal clock signal at a fixed period and a buffering and sampling unit for buffering an inputted address and sampling the address in the fixed period in response to the internal clock signal.

9 Claims, 4 Drawing Sheets

APPARATUS AND METHOD FOR INPUTTING ADDRESS SIGNALS IN SEMICONDUCTOR MEMORY DEVICE

FIELD OF THE INVENTION

The present invention relates to an apparatus and a method for inputting address signals in semiconductor memory device; and, more particularly, to an apparatus and a method for inputting address signals in semiconductor memory device to avoid the damage of the cell data caused by the change of address signals before a restore and to reduce the stand-by current.

BACKGROUND OF THE INVENTION

Generally, the dynamic random access memory (DRAM) is widely known as a semiconductor memory device having a memory cell with the capacitor. Since the DRAM includes one access transistor and one capacitor, the DRAM is advantageous in high integration. However, in order to maintain the data stored in the cell, the refresh is required periodically in the DRAM. On the other hand, although the refresh is not required in the static RAM(SRAM) because it operates in a latch type, however, it has disadvantage that the integration is not high as the DRAM because a unit cell has to include the a plurality of transistors.

The pseudo SRAM and the virtual SRAM are widely known for the devices having the advantages of both DRAM and SRAM devices. Although a capacitor is used to store data in a cell, the refresh is concealed easily in both the pseudo SRAM and the virtual SRAM.

However, in case of using the capacitor as a cell, a restriction is imposed on the restore because the address signals should not be changed until the data is restored on the capacitor. Particularly, a tRAS control signal is used in the DRAM in order that new addresses are inputted after restoring enough data in the cell. However, the SRAM does not have such tRAS specification, an apparatus and a method are necessary to guarantee an input of new address after restoring enough data in the cell.

SUMMARY OF THE INVENTION

It is, therefore, an object of the present invention to provide an apparatus and method for address input device in the semiconductor memory device.

In accordance with an aspect of the present invention, there is provide an apparatus for inputting address signals in a semiconductor memory device having a unit cell including a capacitor, comprising: an internal clock generating means for generating and outputting an internal clock signal at a fixed period; and a buffering and sampling means for buffering input address signals and sampling input address signals at the fixed period in response to the internal clock signal.

In accordance with another aspect of the present invention, there is provide a method for inputting address signals in a semiconductor memory device having a unit cell including a capacitor, comprising the steps of: buffering an input address signal applied from a pad; generating an internal clock signal at a fixed period; and sampling the fixed period by using the buffered input address signal as the internal clock signal.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Hereinafter, an address input circuit according to the present invention will be described in detail referring to the accompanying drawings.

Figure 1:
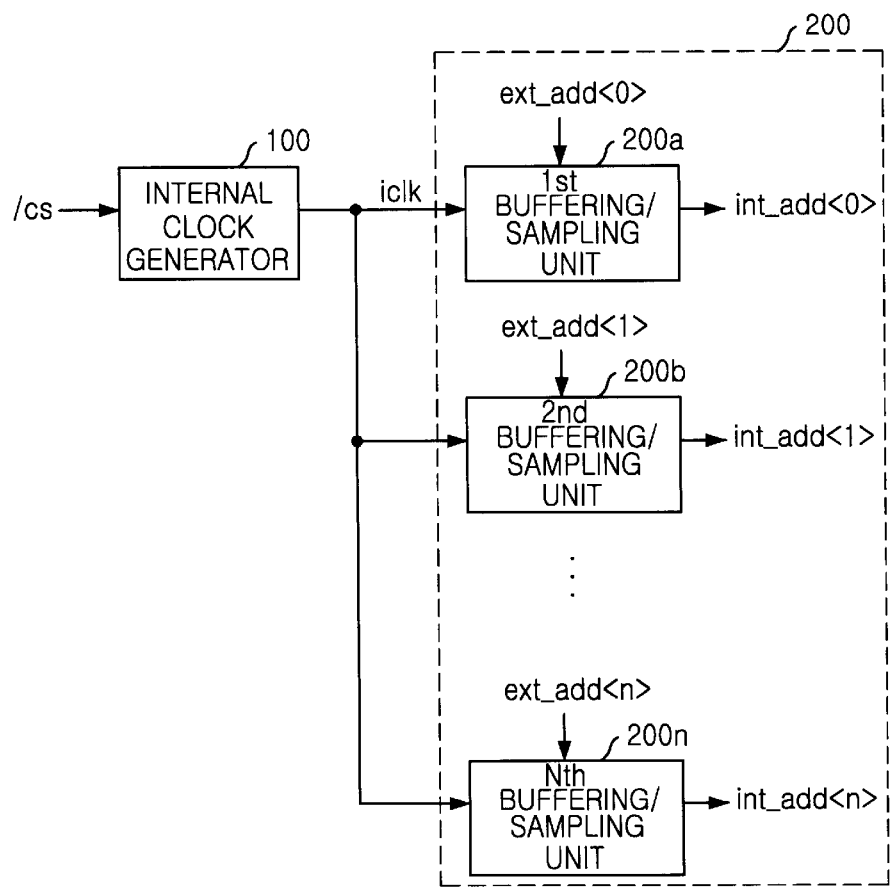
FIG. 1 is a block diagram for an address input device of the present invention.

FIG. 1 is a block diagram for an address input device of the present invention.

In FIG. 1, the address input device includes an internal clock generator 100 for generating an internal clock signal iclk periodically in response to a chip selection signal /CS and a buffering/sampling, unit 200 for generating an internal address signal int_add<0:n> by sampling an external address signal ext_add<0:n> within a tRC cycle after buffering the external address signal and transforming the internal clock signal iclk into a strobe signal, where the tRC cycle is required time for restoring enough data in the cell.

The internal address signal provided from the buffering/sampling unit 200 is provided to the column/row decoder and an address transition detector.

The buffering/sampling unit 200 includes a plurality of buffering/sampling units 200a to 200n receiving the external address signal ext_add<0:n> inputted through each different pad.

Figure 2:
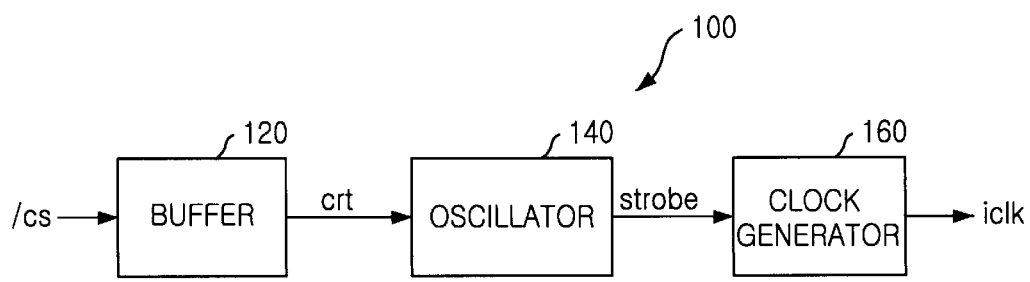
FIG. 2 is a detailed block diagram for the internal clock generator of FIG. 1.

FIG. 2 is a detailed block diagram for the internal clock generator 100. The internal clock generator 100 includes a buffer 120 for generating a control signal in response to the chip selection signal /CS, an oscillator 140 for driving the tRC cycle in response to the control signal and a clock generation unit 160 for generating the internal clock signal iclk in response to the output of the oscillator 140.

Figure 3:
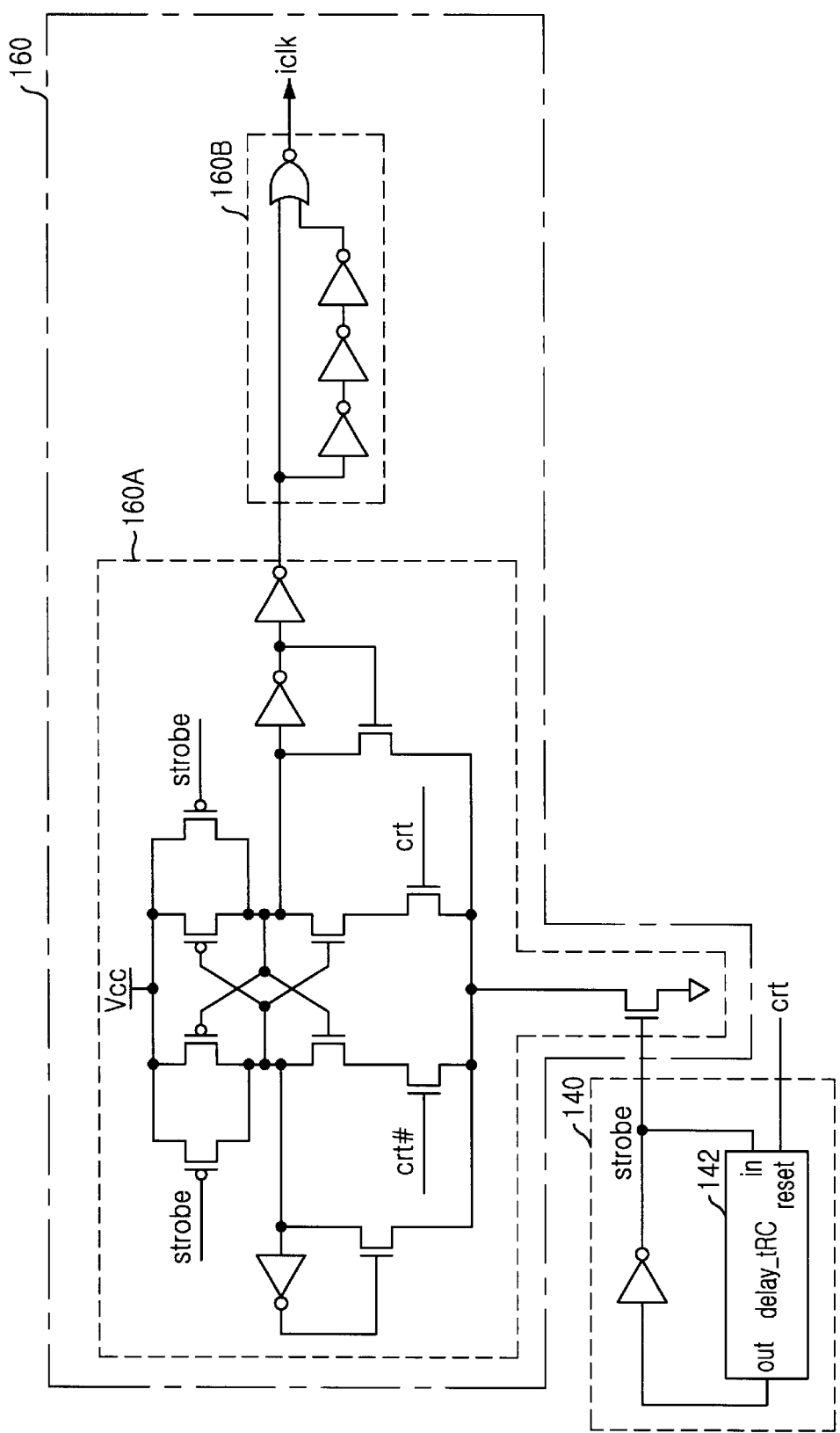
FIG. 3 is a detailed circuit diagram for an oscillator and a clock generation unit of FIG. 1.

FIG. 3 is a detailed circuit diagram for the oscillator 140 and the clock generation unit 160 of the internal clock generator 100. The oscillator 140 includes a delay chain unit 142 for generating a strobe signal by delaying an in signal as much as tRC cycle provided from the buffer.

The clock generator 160 includes a latch circuit 160A for latching the strobe signal used as an enable signal to drive the latch circuit 160A and a pulse generator 160B for inputting the output of the latch circuit 160A. The latch circuit 160A is an ordinary cross couple latch.

Figure 4:
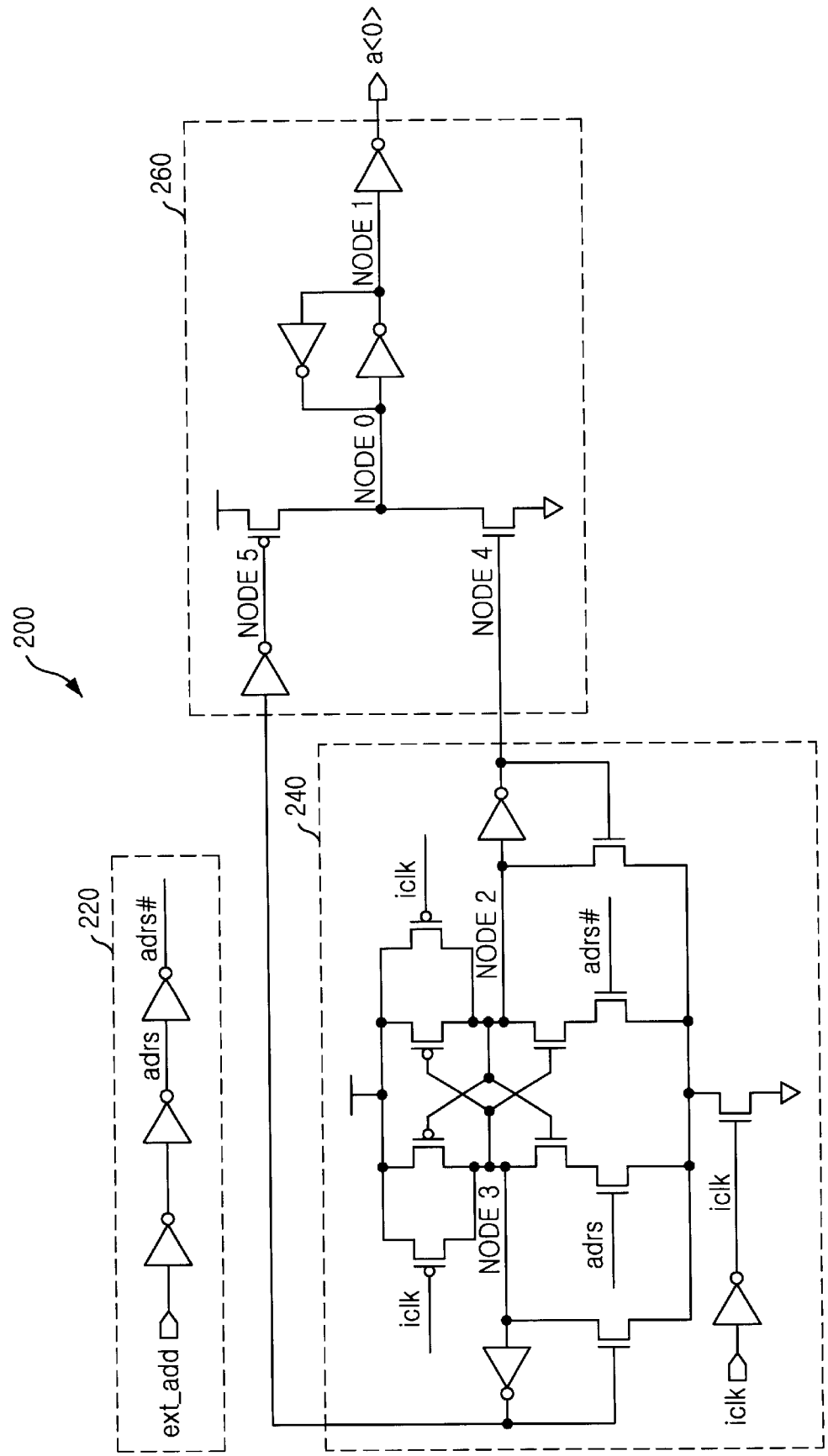
FIG. 4 is a detailed circuit diagram for a buffering/sampling unit.

FIG. 4 is a detailed circuit diagram for the buffering/sampling unit 200. The first to the nth buffers 200a to 200nth are under this unit.

The buffering/sampling unit 200 includes an input buffer unit 220 for buffering the external address signal ext_add applied from the pad, the latch unit 240 for latching the input address signal adrs, /adrs by transforming the internal clock signal iclk into the strobe signal and output buffer unit 260 for outputting the internal address signal int_add by buffering the output of the above latch unit 240. The latch unit 240 includes an ordinary cross couple latch and the output buffer unit 260 has a pull-up driver 242 and a pull-down driver 244.

Figure 5:
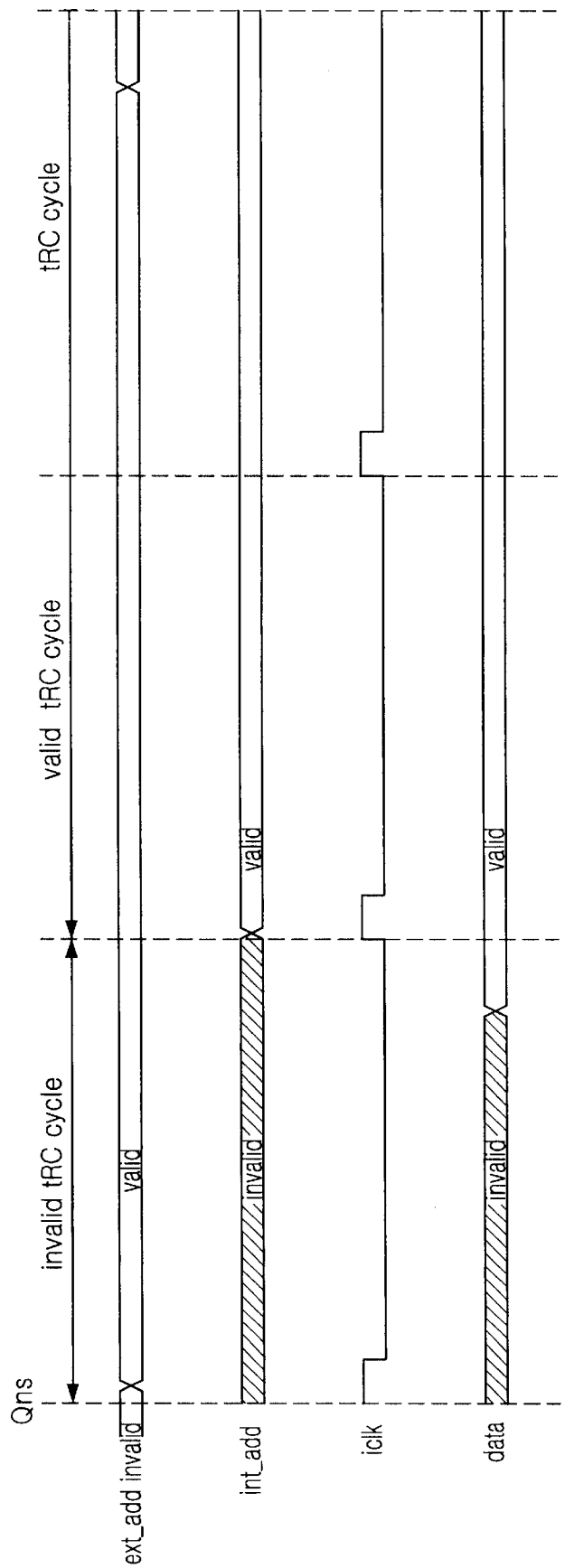
FIG. 5 is a timing chart of the present invention.

FIG. 5 is a timing graph of the present invention.

In the active state by activating the chip selection signal /CS, the control signal is activated by the buffer 120 in the internal clock generator 100 and the oscillator 140 is operated by the control signal. The oscillator is operated continuously within the tRC cycle, and the internal clock signal iclk is generated by the clock generator 160 in the every tRC cycle in order to generate each buffering/sampling unit 200a to 200nth. Therefore, turning off the internal clock generator 100 in the stand-by state can reduce the stand-by current because the internal clock generator 100 is operated only in the active state of the chip.

The latch unit 240 in the buffering/sampling unit 200a is latched when the internal clock signal iclk is in the 'high' logic state by confirming the buffered input address signal addrs, /addrs. That is, the input address signal is latched by transforming the internal clock signal iclk into the strobe signal in order to sample the external address signal in the tRC cycle in the internal clock signal iclk.

Thus, the damage of the cell data caused by generating address signal within the short period of time can be avoided by generating the internal signal having a fixed period and sampling the external address signal periodically using this internal signal during the external address signal process of the present invention. Therefore, the cell data is restored with the plenty of time internally although the next address signal is inputted in the short period of time externally.

In the SRAM having one access transistor and one capacitor, the damage of the cell data caused by the generating address signal within the short period of time can be avoided.

Furthermore, the stand-by current can be reduced by the chip selection signal in the present invention.

While the present invention has been described with respect to the particular embodiments, it will be apparent to those skilled in the art that various changes and modifications may be made without departing from the spirit and scope of the invention as defined in the following claims.

What is claimed is:

1. An address input apparatus of a semiconductor memory device having a unit cell including a capacitor, comprising:
    an internal clock generating means for generating and outputting an internal clock signal at a fixed period; and
    a buffering and sampling means for buffering input address signals and sampling the input address signals at the fixed period in response to the internal clock signal, wherein the buffering and sampling means includes a plurality of buffering and sampling units, which respectively correspond to the input address signals.

2. The apparatus as recited in claim 1, wherein the internal clock generating means is driven by a chip selection signal.

3. The apparatus as recited in claim 2, wherein the internal clock generating means includes:
    a buffer means for buffering the chip selection signal and generating a control signal;
    an oscillator driven by the control signal; and
    a clock generator for generating the internal clock signal in response to an output of the oscillator.

4. The apparatus as recited in claim 3, wherein the oscillator includes a delay chain unit receiving the control signal as a reset signal and delaying the control signal in order to generate a strobe signal.

5. The apparatus as recited in claim 2, wherein the buffering/sampling means latches the input address signal in synchronization with a clock edge of the internal clock signal.

6. The apparatus as recited in claim 2, wherein the buffering/sampling means includes:
    an input buffer unit for buffering the input address signals applied from a pad;
    a latch unit for latching the buffered address signal in response to the internal clock; and
    an output buffer unit for outputting the internal address signals by buffering an output of the latch unit.

7. An address input method of a semiconductor memory device having a unit cell including a capacitor, comprising the steps of:
    a) buffering a plurality of input address signals applied from pads;
    b) generating an internal clock signal at a fixed period; and
    c) sampling the buffered input address signals at the fixed period in response to the internal clock signal in a plurality of sampling units, which respectively correspond to the input address signals.

8. The method as recited in claim 7, wherein the step c) includes the steps of:
    c1) latching the buffered input address signal in response to the internal clock signal; and
    c2) outputting the latched input address signal via an output buffer.

9. The method as recited in claim 7, wherein the step b) includes the step of generating the internal clock signal by using a chip selecting signal.

* * * * *